United States Patent
Tao

(10) Patent No.: US 9,702,936 B2
(45) Date of Patent: Jul. 11, 2017

(54) SMART HANDLER RESOURCE DISTRIBUTION SYSTEM

(71) Applicant: Lifeng Tao, Tianjin (CN)

(72) Inventor: Lifeng Tao, Tianjin (CN)

(73) Assignee: NXP USA, INC., Austin, TX (US)

( * ) Notice: Subject to any disclaimer, the term of this patent is extended or adjusted under 35 U.S.C. 154(b) by 481 days.

(21) Appl. No.: 14/461,434

(22) Filed: Aug. 17, 2014

(65) Prior Publication Data

US 2015/0120234 A1      Apr. 30, 2015

(30) Foreign Application Priority Data

Oct. 29, 2013    (CN) .......................... 2013 1 0519678

(51) Int. Cl.
   G01R 31/02      (2006.01)
   G01R 31/319     (2006.01)
   G01R 31/28      (2006.01)

(52) U.S. Cl.
   CPC ... G01R 31/31907 (2013.01); G01R 31/2893 (2013.01)

(58) Field of Classification Search
   USPC ...................................... 324/750.087, 754.08
   See application file for complete search history.

(56) References Cited

U.S. PATENT DOCUMENTS

| | | |
|---|---|---|
| 5,931,952 A | 8/1999 | Lesmeister |
| 6,731,127 B2 | 5/2004 | Watts |
| 7,915,903 B2 | 3/2011 | Lu et al. |
| 2003/0062888 A1* | 4/2003 | Magliocco ....... G01R 31/31903 324/750.08 |

* cited by examiner

*Primary Examiner* — Vincent Q Nguyen
(74) *Attorney, Agent, or Firm* — Charles E. Bergere

(57) ABSTRACT

A system for concurrently testing multiple semiconductor components includes multiple testers, each including a processor and a memory configured to store and execute control signals for completing testing of one of the semiconductor components, a tester side docking board, and a tester communication port. A handler has multiple test sites, each of which is configured to receive one of the semiconductor components, a handler side docking board, and a handler communication port. A controller is located externally from the testers and the handler and is in communication with each of the testers and the handler through the tester and handler communication ports. Communication between each of the testers and the handler occurs through the controller, and each of the testers is connected, via the tester side docking board, to a corresponding one of the semiconductor components through the handler side docking board.

8 Claims, 2 Drawing Sheets

SMART HANDLER RESOURCE DISTRIBUTION SYSTEM

BACKGROUND OF THE INVENTION

The present invention is directed to a system and method for concurrently testing a plurality of semiconductor components such as integrated circuits.

Automated test equipment (ATE) is typically used to test manufactured semiconductor components, such as integrated circuits or the like. The testing system usually includes a tester coupled with a handler. The handler is a placement tool that situates a device under test (DUT), such as an integrated circuit, at a test site within the handler. The tester sends instructions to the handler, such as binning sort information, start/stop signals, and the like for conducting testing of the DUT. The tester is also coupled to the DUT to detect and store results of the testing for reporting to the operator.

Industrial systems connect one tester to one handler. Common handlers can concurrently test integrated circuits using between eight and thirty-two test sites within the handler. However, testers are more often limited to between one and eight test channels. For high pin-count devices, the capability of a tester is often further reduced to two or four channels, or may even be limited to a single channel. Such limitations at the tester result in wasting at least 50-75% of the handler capability.

Handlers are expensive, costing hundreds of thousands of dollars each, and increasing the throughput under the above-described conditions currently requires an increase in the number of handlers. It is therefore desirable to provide a more efficient and cost-effective manner for increasing the throughput of automated circuit testing while using existing testing technology with minimal modification.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings.

DETAILED DESCRIPTION OF THE INVENTION

Figure 1:
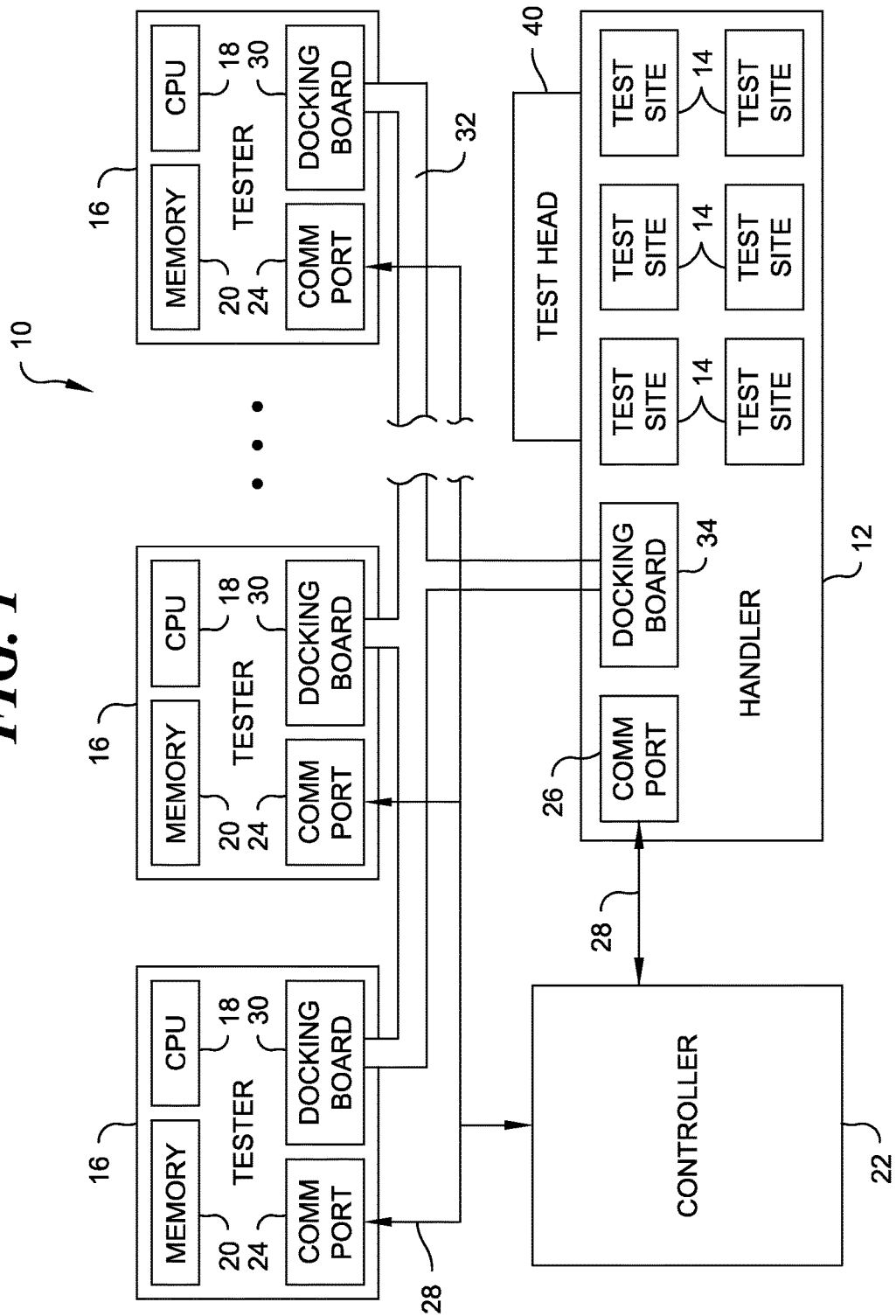
FIG. 1 is a schematic block diagram of a system for concurrently testing a plurality of integrated circuits in accordance with an embodiment of the invention.

Referring to the drawings, wherein the same reference numerals are used to designate the same components throughout the several figures, there is shown in FIG. 1 a system 10 for concurrently testing a plurality of semiconductor components such as integrated circuits (not shown). Preferably, the testing includes a number of electrical tests performed by connecting or probing contacts of the integrated circuit at various signal levels, and may include testing under various types of environments, including low/high temperature, low/high pressure, low/high humidity, or the like. Other tests, such as mechanical testing or the like may be performed as well within the system 10. By "con- currently" it is merely meant that testing of an integrated circuit overlaps with the testing one or more other integrated circuits. The testing of all of the integrated circuits need not start and end at the same time, although it may, if desired.

The system 10 includes a handler 12 having a plurality of test sites 14 located therein, each of which is configured to receive one of the plurality of integrated circuits. The test sites 14 may comprise individual environmentally controlled chambers for varying temperatures, pressures, humidity, or the like, although this is not necessary. The test sites 14 may instead all be subject to the same environmental conditions, and individual test sites 14 need not be formed as separate individual chambers. The test site 14 need only include an area to accommodate an integrated circuit and any sockets, probes, or the like necessary to conduct the desired testing.

The handler 12 also preferably includes robotic equipment (not shown), such as pick-and-place machines, conveyors, robotic arms, or the like for moving integrated circuits to and from the various test sites 14. However, it is also contemplated that a user may manually place integrated circuits in the respective test sites 14 of the handler 12. In a preferred embodiment, the user inputs the integrated circuits to the handler 12, which automatically distributes the integrated circuits to the test sites 14 for testing, and upon completion, the integrated circuits are output automatically from the handler 12 depending on the test results (i.e., the integrated circuits are binned for packaging or discarding).

The handler 12 may preferably be a commercially available high parallelism type, such as the CASTLE (up to ×8 parallelism) or the MATRIX (up to ×32 parallelism) available from Delta Design.

The system 10 also includes a plurality of testers 16, each of which includes at least a CPU or processor 18 and a memory 20 configured to store and, with the processor 18, to execute control signals for completing testing of one of the integrated circuits. Such control signals may include binning (sorting) instructions, test parameters, start/stop signals, or the like. Each tester 16 may further include a display and an input device (not shown) for operation of the tester 16 by the user. However, as will be described in more detail below, the system 10 may centralize control of the testers 16 such that display and input devices may not be necessary for each individual tester 16.

The testers 16 are preferably substantially similar or identical to one another for ease of use and simplification of communication and reporting. However, different testers 16 may also be used in accordance with the invention.

The system 10 further includes a controller 22 located externally of the testers 16 and the handler 12. The controller 22 may be, for example, a server, a stand-alone computer, or the like. The controller 22 is in communication with each of the plurality of testers 16 and the handler 12 via, for example, respective tester communication ports 24 and a handler communication port 26. The tester and handler communication ports 24, 26 may be wired and/or wireless ports, although it is preferred that the tester and handler communication ports 24, 26 be configured for cable connection to the controller 22, preferably by general purpose interface bus (GPIB) (i.e., IEEE-488 specification) and suitable cables 28. However, other cable types and/or protocols as are known may be specified for communication among the controller 22, testers 16, and handler 12.

Communication between each of the testers 16 and the handler 12 therefore occurs through the controller 22. That is, the control signals from a tester 16 for executing the testing of an integrated circuit are funneled through the controller 22 for distribution to the handler 12. If necessary, the controller 22 is configured to format or otherwise convert the control signals from the tester 16 to the proper format for sending to the handler 12. In this way, the testers 16 do not necessarily need to issue control signals using the same language and/or protocol as the handler 12. The controller 22 may also forward additional information to the handler 12 along with the control signals, such as the identification of the issuing tester 16, the identification of the integrated circuit to which the control signals are applicable, and like information required to carry out the appropriate testing procedures.

Similarly, feedback signals may be provided by the handler 12 to the controller 22, which routes the feedback signals and preferably formats or otherwise converts the feedback signals for sending to the appropriate tester 16. The feedback signals may include, for example, test site 14 information, start/stop indications, environmental conditions, and the like.

Figure 2:
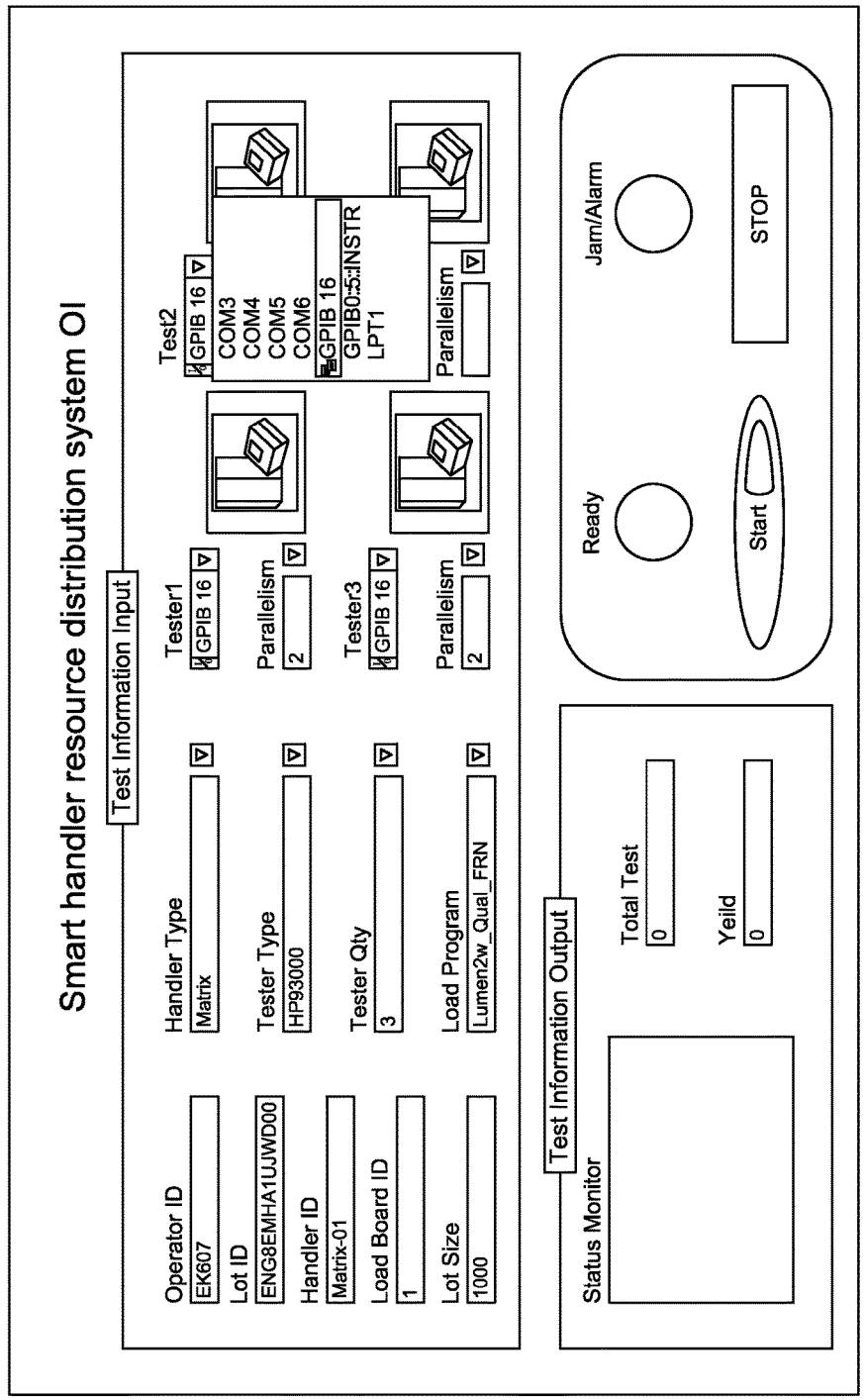
FIG. 2 is a screenshot of an embodiment of a user interface for operating the system of FIG. 1.

The controller 22 preferably includes or is coupled to a display (not shown) and a user input (not shown), which can be a touch screen integrated with the display, a keyboard, or the like. This allows the user to monitor and control the testing of the integrated circuits from a single position instead of at each individual tester 16. For example, a user interface, such as that shown in FIG. 2, may be utilized for this purpose. In the screenshot 100 shown in FIG. 2, the user may set, from the controller 22, the type and identity of the handler 12, the quantity, type, and identification of the testers 16, the identification of the user, the identity and size of the lot of integrated circuits, the connection method for each tester 16, and other like details for testing. The user can also monitor the status, control the start and stopping of testing, and monitor for jams or other alarm conditions affecting the tests.

Returning to FIG. 1, each of the testers 16 is preferably assigned to one of the integrated circuits in the respective test sites 14, and is preferably connected to the respective integrated circuit for evaluation during the testing. For this purpose, each tester 16 includes a tester side docking board 30 that connects, via a cable 32, with a handler side docking board 34 at the handler 12. The docking cable 32 is preferably solely for the purpose of coupling the integrated circuits to the respective testers 16, and it is preferred that no communication between the testers 16 and the handler 12 take place over this docking cable 32, as all such communications should be conducted through the controller 22.

The docking cable 32 is preferably a conventional soft docking cable, although specialized cables could be used as well. The handler side docking board 34 preferably accepts a plurality of cable connections from the plurality of testers 16, although a router (not shown) could be used such that the handler side docking board 34 only has one connection. A Kelvin connection may be used to allow accurate measurement by the testers 16 at the integrated circuits. Additionally or alternatively, offset should be added in the testing program to compensate for cable loss and the like. Preferably, the length of the cable 32 from each tester 16 to the handler 12 should be equal to simplify offset calculations.

A test head 40 may also be provided to interface with the handler 12 to support the integrated circuits. For example, the test head 40 may include the necessary sockets or other connections for the integrated circuit testing, and the handler side docking board 34 may be connected to or formed as part of the test head 40. The test head 40 may be integrated with the handler 12 or detachable therefrom, as desired.

With the system 10 described and claimed herein, significant cost savings, possibly on the order of millions of dollars, can be achieved. For example, instead of purchasing a large number of handlers 12, each connecting to one tester 16, a single handler 12 might be purchased that can handle all of the testers 16. As handlers 12 can cost several hundred thousand dollars, including the necessary kits for testing, reduction of four handlers 12 to one can potentially save at least one million dollars. This is particularly significant since little to no changes are needed at the handler 12 or the testers 16, and the user can operate all of the testers 16 from a single location (i.e., at the controller 22).

In the foregoing specification, the invention has been described with reference to specific examples of embodiments of the invention. It will, however, be evident that various modifications and changes may be made thereto without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A system for concurrently testing a plurality of semiconductor components, the system comprising:
   a plurality of testers, each including a processor and a memory configured to store and execute control signals for completing testing of one of the plurality of semiconductor components, a tester side docking board, and a tester communication port;
   a handler having a plurality of test sites, each of which is configured to receive one of the plurality of semiconductor components, a handler side docking board, and a handler communication port; and a controller located externally from the plurality of testers and the handler and in communication with each of the plurality of testers and the handler through the tester and handler communication ports, wherein communication between each of the plurality of testers and the handler occurs through the controller, and each of the plurality of testers is connected, via the tester side docking board, to a corresponding one of the plurality of semiconductor components through the handler side docking board, wherein the controller is configured to format the control signals received from each of the plurality of testers for sending to the handler; and wherein the controller is configured to format feedback signals received from the handler for sending to one or more of the plurality of testers.

2. The system of claim 1, wherein the tester communication ports and the handler communication ports are connected to the controller using general purpose interface bus (GPIB) cables.

3. The system of claim 1, wherein the controller includes a user interface configured to allow user control over operation of the plurality of testers and the handler.

4. The system of claim 1, further comprising a test head interfacing with the handler to support the plurality of semiconductor components.

5. A method for concurrently testing a plurality of semiconductor components, the method comprising:

connecting a plurality of testers and a handler to an external controller, each of the testers including a processor and a memory configured to store and execute control signals for completing testing one of the plurality of semiconductor components, the handler having a plurality of test sites, each of which is configured to receive one of the plurality of semiconductor components;

inputting the plurality of semiconductor components to the handler, each of the semiconductor components being assigned to a single tester;

sending, via the controller, control signals from the plurality of testers to the handler to conduct testing of the respective semiconductor components;

outputting from the handler each of the plurality of semiconductor components following completion of testing by the correspondingly assigned tester;

formatting, by the controller, the control signals received from each of the plurality of testers for sending to the handler; and formatting, by the controller, feedback signals received from the handler for sending to one or more of the plurality of testers.

6. The method of claim 5, wherein the connecting of the testers and the handler to the controller is performed using general purpose interface bus (GPIB) cables.

7. The method of claim 5, further comprising operating the plurality of testers and the handler through a user interface communicating with the controller.

8. The method of claim 5, further comprising interfacing a test head with the handler to support the plurality of semiconductor components.

* * * * *